United States Patent [19]

Tsuchimoto

[11] Patent Number: 5,426,329
[45] Date of Patent: Jun. 20, 1995

[54] SEMICONDUCTOR DEVICE WITH ARSENIC DOPED SILICON THIN FILM INTERCONNECTIONS OR ELECTRODES

[75] Inventor: Junichi Tsuchimoto, Hyogo, Japan

[73] Assignee: Mitsubishi Denki Kabushiki Kaisha, Tokyo, Japan

[21] Appl. No.: 296,267

[22] Filed: Aug. 25, 1994

Related U.S. Application Data

[63] Continuation of Ser. No. 43,230, Apr. 6, 1993, abandoned.

[30] Foreign Application Priority Data

Jun. 8, 1992 [JP] Japan ................................. 4-147646

[51] Int. Cl.6 ..................... H01L 23/48; H01L 23/40; H01L 29/62; H01L 29/64
[52] U.S. Cl. .................... 257/607; 257/610; 257/612
[58] Field of Search ............... 257/607, 609, 610, 611, 257/612, 49, 65, 52, 66, 347

[56] References Cited

U.S. PATENT DOCUMENTS 4,722,913 2/1988 Miller ....................... 257/607

OTHER PUBLICATIONS

"Low Temperature $Si_2H_6$ Si Epitaxy In-Situ Doped with $AsH_3/SiH_4$", by M. Sadamoto, et al, Journal of Electronic Materials, vol. 19, No. 12, 1990, pp. 1395–1402.

"GaAs Growth Using Tertiarybutylarsine and Trimethylgallium", by C. A. Larsen et al, Journal of Crystal Growth 93, 1988, pp. 15–19.

"Alternate Sources and Growth Chemistry for OMVPE and CBE Processes", by G. B. Stringfellow, Journal of Crystal Growth 105, 1990, pp. 260–270.

*Primary Examiner*—Sara W. Crane
*Assistant Examiner*—S. V. Clark
*Attorney, Agent, or Firm*—Lowe, Price, LeBlanc & Becker

[57] ABSTRACT

A principal feature of the present invention is to obtain a semiconductor device including a silicon thin film for use as interconnections or an electrode. The semiconductor device includes a semiconductor substrate, and a silicon thin film provided on the semiconductor substrate. Arsenic and carbon are added in the silicon thin film. The arsenic is distributed at a uniform concentration along a depth of the silicon thin film.

7 Claims, 5 Drawing Sheets

SEMICONDUCTOR DEVICE WITH ARSENIC DOPED SILICON THIN FILM INTERCONNECTIONS OR ELECTRODES

This application is a continuation of application Ser. No. 08/043,230, filed Apr. 6, 1993, now abandoned.

BACKGROUND OF THE INVENTION

1. Field of the Invention

The present invention relates generally to semiconductor devices and, more particularly, to a semiconductor device including a silicon thin film for use as an interconnection or an electrode. The invention further relates to a method of manufacturing such a semiconductor device.

2. Description of the Background Art

In order to apply a conductivity to a silicon thin film for use as an interconnection or an electrode, it is necessary to implant arsenic or phosphorus into the silicon thin film.

FIGS. 5A–5E show a method of forming an interconnection or an electrode by implanting arsenic or phosphorus into a silicon thin film.

With reference to FIG. 5A, a field oxide film 2 is formed on a surface of a silicon substrate 1.

A gate electrode 4 is formed on the silicon substrate 1 with a gate oxide film 3 interposed therebetween, with reference to FIG. 5B.

With reference to FIG. 5C, an interlayer insulating film 5 is formed on the silicon substrate 1 to cover the gate electrode 4. Openings 5a and 5b for forming a source region 6 and a drain region 7 are formed in the interlayer insulating film 5. After that, implanting impurity ions onto the surface of the silicon substrate 1 leads to formation of the source region 6 and the drain region 7. With reference to FIG. 5D, a silicon thin film 8 is formed to fill the openings 5a and 5b. The silicon thin film 8 does not exhibit a conductivity unless it includes impurities. It is thus necessary to implant arsenic or phosphorus. With phosphorus employed as impurity ions 10, since phosphorus has a higher diffusion coefficient, there arises a problem that phosphorus goes through the silicon thin film 8 and arrives in the silicon substrate 1. When arsenic is employed as the impurity ions 10, since arsenic has a lower diffusion coefficient, the above problem does not arise, however, the impurity ions are likely to remain in the surface of the silicon thin film 8. Thus, there is a problem that arsenic is not implanted at a uniform concentration along the depth of the silicon thin film 8.

With reference to FIG. 5E, the silicon thin film implanted with the impurity ions is patterned to form an interconnection 11 (or an electrode).

Formation of an interconnection by employing an impurity ion implantation method has the above-described problems.

As a method of implanting arsenic into a silicon thin film at a uniform concentration along the depth of the thin film, a CVD method as described below has been developed. (Journal of Electronic Materials, Vol. 19, No. 12, 1990, pp. 1395–1402)

FIG. 6 is a conceptual diagram of a CVD apparatus for use in formation of a silicon thin film to which arsenic is added, on semiconductor wafer 14. This CVD apparatus includes a vacuum chamber 12. The vacuum chamber 12 has a diameter of e.g., 30 cm and a length of e.g., 2 m. For example, 100 sheets of silicon wafer 14 are disposed in the vacuum chamber 12. A heater 13 is provided outside the vacuum chamber 12. The vacuum chamber 12 incorporates a silane source 15 for introducing silane ($SiH_4$) into the vacuum chamber 12 and an arsenic source 16 for introducing an arsine gas ($AsH_3$) into the vacuum chamber 12.

The silane gas and then the arsine gas are introduced into the vacuum chamber 12, and the inside of the vacuum chamber 12 is heated to 600°–800° C. by use of the heater 13. This heating decomposes the silane into silicon atoms and hydrogen, and the arsine into arsenic atoms and hydrogen. With the produced silicon atoms and arsenic atoms deposited on the semiconductor wafer 14, a silicon thin film including arsenic is formed.

As described above, arsine is employed in the formation of the silicon thin film by employing the conventional CVD method. This arsine is extremely highly toxic as well known. It is reported in general that a lethal dose of arsine is 0.05 ppm. Thus, a conventional step of forming a silicon thin film with addition of arsenic, using arsine is one of the most dangerous works in a semiconductor manufacture process.

SUMMARY OF THE INVENTION

An object of the present invention is to provide a semiconductor device including a silicon thin film containing arsenic for use as an interconnection or an electrode.

Another object of the present invention is to provide a semiconductor device including a silicon thin film containing arsenic which can be manufactured in a safe method.

A further object of the present invention is to provide a method in which a silicon thin film containing arsenic can be manufactured safely.

In order to achieve the above objects, a semiconductor device in accordance with the present invention includes a semiconductor substrate, and a silicon thin film provided on the semiconductor substrate. Arsenic and carbon are added in the silicon thin film.

In a method of manufacturing a semiconductor device according to another aspect of the present invention, a semiconductor substrate is first placed in an atmosphere including silicon hydride and alkylarsine. The silicon hydride and the alkylarsine are decomposed, thereby forming a silicon thin film containing arsenic on the semiconductor substrate.

In the semiconductor device in accordance with the present invention, arsenic and carbon are added in the silicon thin film. This silicon thin film can be manufactured by employing silane and alkylarsine which is less toxic.

Since alkylarsine is employed as an arsenic source in the method of manufacturing the semiconductor device according to another aspect of the present invention, this method is safer than a conventional manufacturing method employing arsine as an arsenic source.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
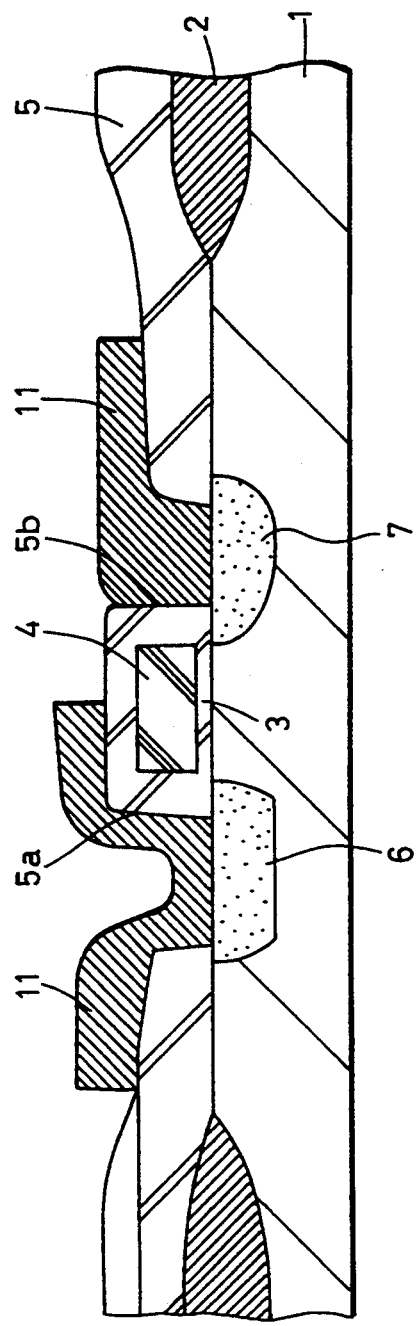
FIG. 1 is a cross-sectional view of a semiconductor device according to one embodiment of the present invention.

An embodiment of the present invention will now be described with reference to the drawings. FIG. 1 is a cross-sectional view of a semiconductor device according to one embodiment of the present invention.

With reference to FIG. 1, a field oxide film 2 is formed on a main surface of a semiconductor substrate 1. A gate electrode 4 is provided on the semiconductor substrate 1 with a gate oxide film 3 interposed therebetween. A source 6 and a drain 7 are provided on opposite sides of the gate electrode 4 in the main surface of the semiconductor substrate 1. An interlayer insulation film 5 is formed on the semiconductor substrate 1 to cover the gate electrode 4. An opening 5a for exposing a surface of the source 6 and an opening 5b for exposing a surface of the drain 7 are provided in the interlayer insulation film 5. Interconnections 11 formed of a silicon thin film are provided to be connected through the openings 5a and 5b to the source 6 and the drain 7. Arsenic and carbon are added in the interconnections 11. Arsenic is distributed at a uniform concentration along a depth of the interconnections 11. The arsenic is included by $1 \times 10^{20}$ to $1 \times 10^{21}$ atoms/cm$^3$ in the interconnections 11.

Figure 2:
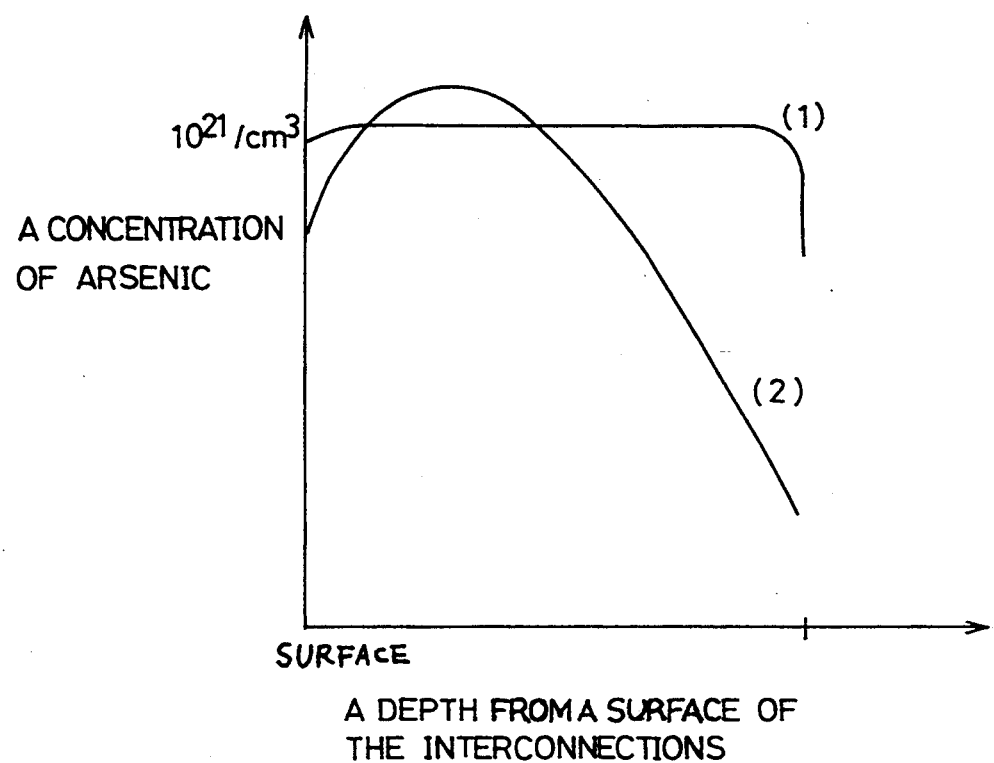
FIG. 2 is a diagram showing distribution of arsenic atoms in a silicon thin film (interconnections) formed in the semiconductor device according to the embodiment.

FIG. 2 is a diagram showing a state of distribution of arsenic atoms in the interconnections 11. A curve (1) indicates a case with interconnections of the semiconductor device according to the embodiment, whereas a curve (2) indicates a case with conventional interconnections obtained by a method of implanting arsenic. In FIG. 2, a longitudinal axis represents a concentration of arsenic, while a lateral axis represents a depth from a surface of the interconnections.

As apparent from FIG. 2, in the conventional method of implanting arsenic, with reference to the curve (2), a large amount of arsenic is distributed in the surface of the interconnections, the concentration of arsenic decreasing as a function of depth from the surface. The interconnections having such arsenic distribution have a poor conductivity.

In contrast, in a silicon thin film of the semiconductor device according to the embodiment, with reference to the curve (1), arsenic is distributed in the interconnections at a uniform concentration along its depth. The interconnections having such arsenic distribution have a good conductivity.

From measurement of electric characteristics of the interconnections 11, it was found that the silicon substrate 1 and the interconnections 11 exhibit a good connection. A resistance value of the interconnections 11 was low. That is, it was found that the added arsenic serves effectively as carries as with respect to silicon.

Figure 3:
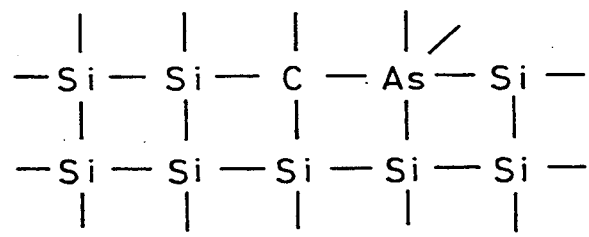
FIG. 3 is a diagram showing arrangement of atoms of the silicon thin film provided in the semiconductor device according to the embodiment.

From examination of the structure of the interconnections 11, it was found that the interconnections 11 have a chemical structure shown in FIG. 3. That is, arsenic atoms and carbon atoms are included in the interconnections 11.

A description will now be made on a method of manufacturing a semiconductor device according to an embodiment.

FIGS. 4A–4E are partial cross-sectional views of a semiconductor device in each step of a semiconductor device manufacturing method according to one embodiment of the present invention.

Figure 4A:
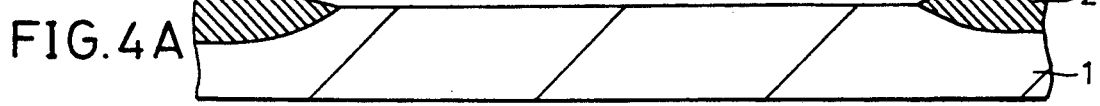
FIGS. 4A–4E are partial cross-sectional views of the semiconductor device in each step of a method of manufacturing a semiconductor device according to an embodiment of the present invention.

With reference to FIG. 4A, a field oxide film 2 is formed on a main surface of a semiconductor substrate 1.

Figure 4B:
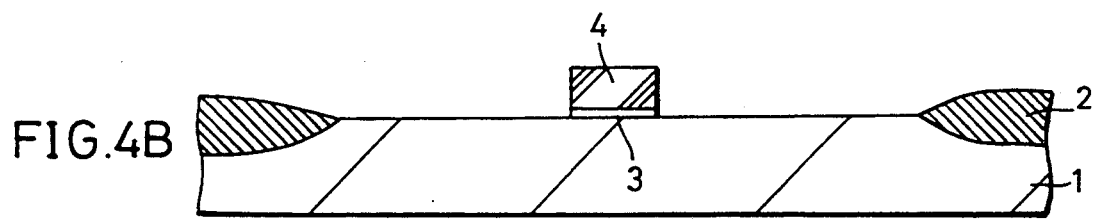

With reference to FIG. 4B, a gate electrode 4 is formed on the semiconductor substrate 1 with a gate oxide film 3 interposed therebetween.

Figure 4C:
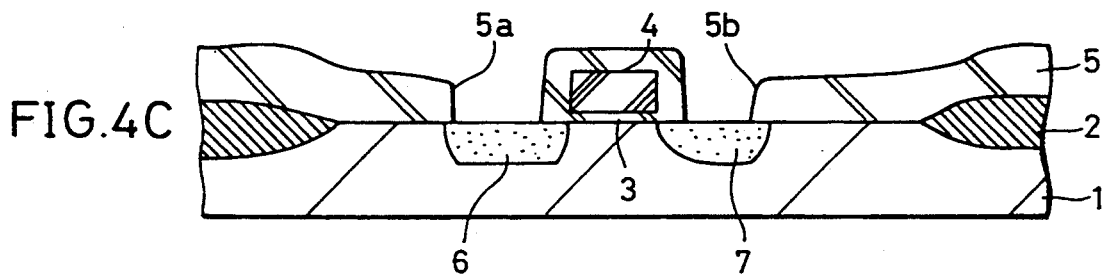
Figure 4D:
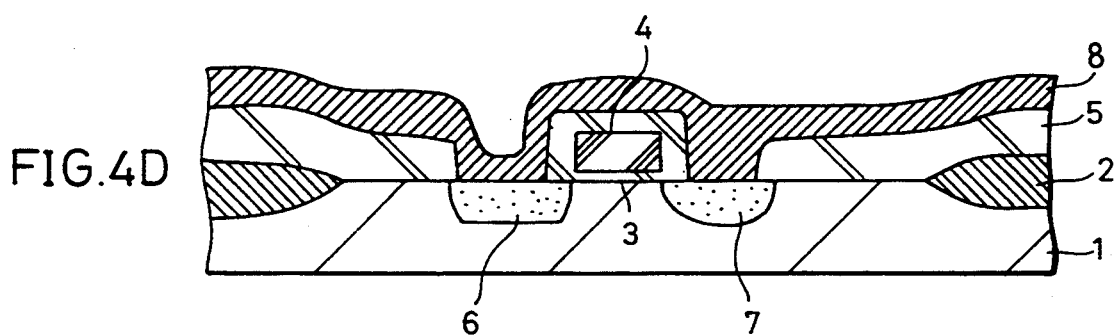

Referring to FIG. 4C, an interlayer insulation film 5 is formed on the semiconductor substrate 1 to cover the gate electrode 4. Openings 5a and 5b for exposing a source region and a drain region are formed in the interlayer insulation film 5. Implanting impurity ions through the openings 5a and 5b onto the main surface of the semiconductor substrate 1 forms a source region 6 and a drain region 7.

Figure 6:
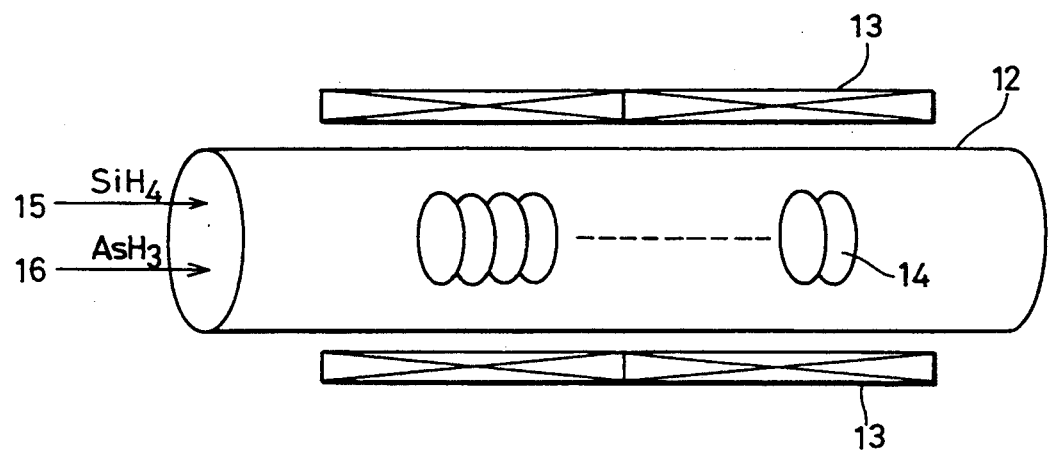
FIG. 6 is a conceptual diagram of a CVD apparatus for forming a silicon thin film including arsenic atoms.

A resultant semiconductor substrate is then disposed in a vacuum chamber 12, with reference to FIG. 6. The semiconductor substrate disposed in the vacuum chamber 12 is hereinafter referred to as semiconductor wafer 14. After the semiconductor wafer 14 is provided in the vacuum chamber 12, an internal atmosphere of the vacuum chamber 12 is substituted with nitrogen. Then, silane (SiH$_4$) is introduced from a silane source 15 into the vacuum chamber 12. Tributylarsine is employed as an arsenic source 16 and introduced into the vacuum chamber 12. The inside of the vacuum chamber 12 is heated to 300°–800° C. by a heater 13. At this time, in order to promote a reaction, a high frequency may be applied to the vacuum chamber 12 to put the chamber 12 under a plasmatic state. The reaction is allowed to be carried out at a low temperature in the plasmatic state.

Tributylarsine is introduced into the vacuum chamber 12 so that arsenic is included by $1 \times 10^{20}$ to $1 \times 10^{21}$ atoms/cm$^3$ in a silicon thin film. With the atmosphere in the vacuum chamber 12 heated to 300°–800° C., silane is decomposed into silicon atoms and hydrogen atoms, and tributylarsine is decomposed into arsenic atoms, carbon atoms and hydrogen atoms. Depositing these silicon atoms, arsenic atoms and carbon atoms on the semiconductor wafer 14 causes a silicon thin film 8 containing arsenic to be formed on the semiconductor substrate 1, with reference to FIG. 4D. A film thickness of the silicon thin film 8 is set to 200–400 nm. A state of arsenic distribution in the silicon thin film obtained by this method is represented by the curve (1) of FIG. 2.

Figure 4E:
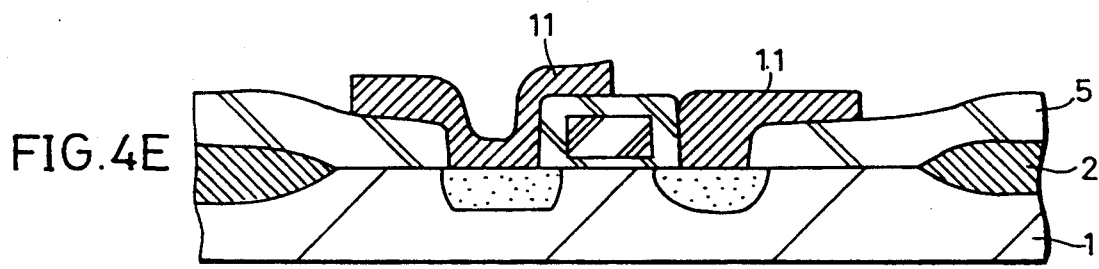
Figure 5A:
FIGS. 5A–5E are partial cross-sectional views of a semiconductor device including interconnections containing arsenic atoms, in each step of a conventional manufacturing method of the semiconductor device.
Figure 5B:
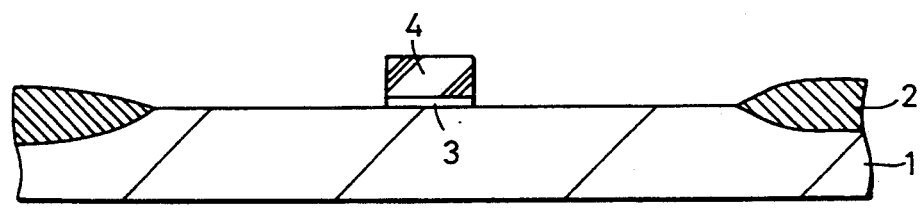
Figure 5C:
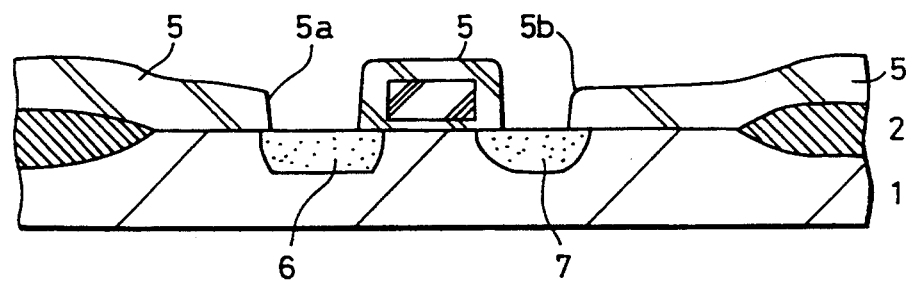
Figure 5D:
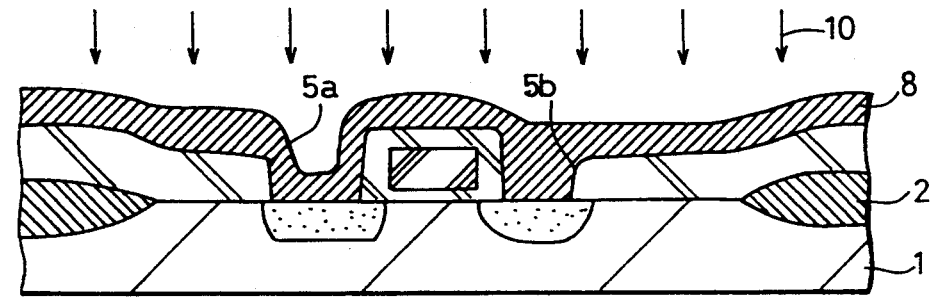
Figure 5E:
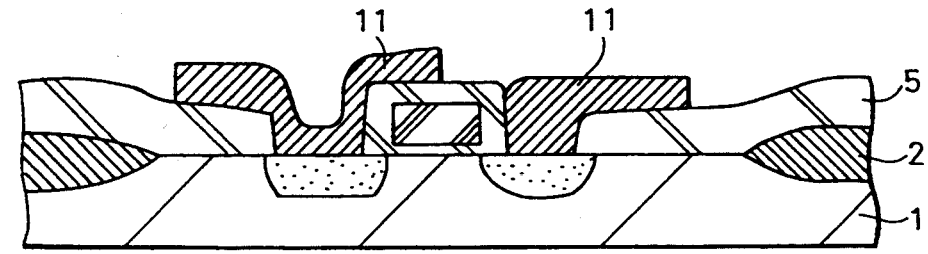

With reference to FIG. 4E, patterning the silicon thin film 8 results in interconnections 11 which are formed of a silicon thin film and contain arsenic, connected to the source region 6 and the drain region 7.

While tributylarsine is employed as alkylarsine in the foregoing embodiment, use of trimethylarsine or triethylarsine provides the same effect as in the embodiment.

A lethal dose of tributylarsine is 70 ppm (LD50) (according to Journal of Crystal Growth Vol. 93, 1988, pp. 15–19). Trimethylarsine and triethylarsine are both nontoxic (according to Journal of Crystal Growth Vol. 105, 1990, pp. 260–270). Accordingly, the method in accordance with the present invention is much safe as compared to a conventional manufacture method employing arsine.

Assuming electric characteristics of a resultant semiconductor device, the semiconductor substrate 1 and the interconnections 11 exhibit a good connection. Also, the interconnections 11 exhibit a smaller resistance value which leads to no problem for practical use. This demonstrates that the added arsenic serves effectively as carries with respect to silicon. In addition, since the method according to the invention ensures a safer work as compared to the conventional method, the present invention is a great contribution to a reduction in cost of products.

While the example in which the silicon thin film is used as interconnections has been proposed in the foregoing embodiment, the present invention is not limited to this, and the silicon thin film can be used also as an electrode.

As has been described heretofore, the semiconductor device in accordance with the present invention can be manufactured by employing alkylarsine which is less toxic. Therefore, the semiconductor device can be manufactured by a safer method than in the conventional method, and can also be supplied in safety and at low cost.

Moreover, according to the semiconductor device manufacturing method in accordance with the present invention, since this method employs less toxic alkylarsine, it is much safer as compared to the conventional manufacturing method.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate; and
   a silicon thin film provided on said semiconductor substrate having arsenic from an alkyl arsine source and carbon distributed in said silicon thin film;
   said arsenic is distributed in said silicon thin film at uniform concentration as a function of a depth of said silicon thin film.

2. A semiconductor device, comprising:
   a semiconductor substrate; and
   a silicon thin film provided on said semiconductor substrate having arsenic and carbon distributed in said silicon thin film;
   wherein said arsenic is distributed in said silicon thin film at uniform concentration as a function of a depth of said silicon thin film and has a concentration of not less than $1 \times 10^{20}$ atom/cm$^3$ in said silicon thin film.

3. A semiconductor device, comprising:
   a semiconductor substrate; and
   a silicon thin film provided on said semiconductor substrate having arsenic and carbon distributed in said silicon thin film;
   wherein said arsenic is distributed in said silicon thin film at uniform concentration as a function of a depth of said silicon thin film and has a concentration of $1 \times 10^{20}$ to $1 \times 10^{21}$ atoms/cm$^3$ in said silicon thin film.

4. The device as recited in claim 3, wherein said silicon thin film is used as an interconnection.

5. The device as recited in claim 3, wherein said silicon thin film is employed as an electrode.

6. The device as recited in claim 3, wherein said silicon thin film is used as an interconnection.

7. The device as recited in claim 3, wherein said silicon thin film is employed as an electrode.

* * * * *